United States Patent
Maleki et al.

(10) Patent No.: US 12,062,591 B2
(45) Date of Patent: Aug. 13, 2024

(54) POWER SEMICONDUCTOR MODULE WITH BASEPLATE AND HEAT DISSIPATING ELEMENT

(71) Applicant: Hitachi Energy Ltd, Zürich (CH)

(72) Inventors: Milad Maleki, Baden (CH); Harald Beyer, Lenzburg (CH); Dominik Truessel, Bremgarten (CH)

(73) Assignee: Hitachi Energy Ltd, Zürich (CH)

( * ) Notice: Subject to any disclaimer, the term of this patent is extended or adjusted under 35 U.S.C. 154(b) by 169 days.

(21) Appl. No.: 17/159,257

(22) Filed: Jan. 27, 2021

(65) Prior Publication Data

US 2021/0233831 A1 Jul. 29, 2021

(30) Foreign Application Priority Data

Jan. 29, 2020 (EP) ..................................... 20154276

(51) Int. Cl.
*H01L 23/40* (2006.01)
*H01L 23/31* (2006.01)

(52) U.S. Cl.
CPC ...... *H01L 23/4006* (2013.01); *H01L 23/3171* (2013.01); *H01L 2023/4081* (2013.01); *H01L 2023/4087* (2013.01)

(58) Field of Classification Search
CPC ......... H01L 23/49838–49844; H01L 23/5386; H01L 23/4006; H01L 23/4081; H01L 23/3171

See application file for complete search history.

(56) References Cited

U.S. PATENT DOCUMENTS

| | | |
|---|---|---|
| 2013/0193591 A1 | 8/2013 | Groening et al. |
| 2015/0289356 A1 | 10/2015 | Izuo et al. |
| 2018/0082980 A1 | 3/2018 | Liang et al. |
| 2019/0279927 A1 | 9/2019 | Hartmann et al. |

FOREIGN PATENT DOCUMENTS

| | | |
|---|---|---|
| CN | 106298695 A | 1/2017 |
| CN | 109997223 A | 7/2019 |
| DE | 202015006897 U1 | 11/2015 |
| DE | 102017218875 A1 | 4/2019 |
| JP | 2010258200 A | 11/2010 |
| WO | 2014083717 A1 | 6/2014 |
| WO | 2019081107 A1 | 5/2019 |

*Primary Examiner* — Laura M Menz
*Assistant Examiner* — Candice Chan
(74) *Attorney, Agent, or Firm* — Slater Matsil, LLP

(57) ABSTRACT

A power semiconductor module includes a baseplate that has a first region at a first side located adjacent to an edge of the baseplate and proceeding in a first plane. An encapsulation material covers portions of the baseplate so that the first region of the baseplate is free of the encapsulation material and the baseplate at the edge side adjacent to the first region is at least partly covered by the encapsulation material. The baseplate at its first side is configured for being provided with an electric circuit and the baseplate at its second side is configured for being brought into contact to a heat dissipating element by applying a clamping force with a clamping part to the first region.

20 Claims, 2 Drawing Sheets

POWER SEMICONDUCTOR MODULE WITH BASEPLATE AND HEAT DISSIPATING ELEMENT

CROSS-REFERENCE TO RELATED APPLICATIONS

This application claims the benefit of European Patent Application No. 20154276.8, filed on Jan. 29, 2020, which application is hereby incorporated herein by reference.

TECHNICAL FIELD

Embodiments of the disclosure relate to a power semiconductor module.

BACKGROUND

Power semiconductor modules are generally widely known in the art. Power semiconductor modules may comprise a baseplate that may carry an electric circuit comprising one or more power semiconductor devices. For protection of the power semiconductor module, the latter may be encapsulated at least in part by an encapsulation material. The encapsulation may be formed in a transfer molding process. Transfer molding is a manufacturing process where the encapsulation material may be forced into a mold. During this process the encapsulation material may not only cover the electric circuit on the baseplate, but also an edge side of the baseplate.

In order to ensure the protection of the power semiconductor module, encapsulation materials usually possess adequate mechanical strength, good adhesion to components of the semiconductor module, chemical and electrical resistance, high thermal stability, and moisture resistance in the used temperature range.

The electric circuit of the power semiconductor module may produce heat that needs to be dissipated in order to maintain the functionality of the power semiconductor module. There are different cooling techniques in order to dissipate heat away from the baseplate of the power semiconductor modules, such as bringing the baseplate into contact with a cooler that may provide a coolant flow for efficient heat dissipation. It may be provided that a module with flat baseplate is clamped to a cooler surface. A module with baseplate having cooling fins is clamped to an opening of a cooler, so that cooling fins get in contact with coolant.

The baseplate is often attached to a cooler by mechanically connecting the cooler and the power semiconductor module. A clamping part may be used to press the baseplate of the power semiconductor module against the cooler by a clamping force. The clamping force may be exerted in order to provide sufficient tightness of the connection between the baseplate and the cooler and/or in order to provide proper sealing in case a cooling fluid is provided with an open cooler having cooling channels facing the baseplate.

However, exerting the clamping force to the encapsulation material may damage the encapsulation material and affect the integrity of the power semiconductor module.

German patent document DE 20 2015 006 897 U1 describes that an interconnection device such as a lead frame is connected to the baseplate being encapsulated by the encapsulation material.

German patent document DE 10 2017 218 875 A1 and counterpart WO 2019/081107A1, which was published in English, describe a power module comprising a baseplate, an electronic component which is mounted on an upper surface of the baseplate, and an encapsulation body encapsulating the electronic component and the base plate. The encapsulation body is designed such that a part of the upper surface of the base plate is externally accessible for attaching the power module with a clamping device.

However, the above cited references still give room for improvements especially regarding the mechanical integrity of the power semiconductor module.

SUMMARY

Embodiments of the present invention relate to a power semiconductor module having an improved producibility and quality of the produced modules. As such, embodiments can provide a solution for overcoming at least one of the prior art at least in part. Particular embodiments of the present invention provide a power semiconductor module having an improved producibility and a high quality.

In one embodiment, a power semiconductor module comprises a baseplate that is at least in part covered by an encapsulation material. The baseplate is adapted for being connected to a heat dissipating element by applying a clamping force with a clamping part. The power semiconductor module has an improved producibility and an improved long-term reliability and integrity of the molded part.

In a particular embodiment, a power semiconductor module comprises a baseplate being at least in part covered by an encapsulation material. The baseplate comprises a first side, a second side being located opposite to the first side, and an edge side connecting the first side and the second side. The baseplate at its first side is configured for being provided with an electric circuit and the baseplate at its second side is configured for being brought into contact to a heat dissipating element. The baseplate comprises at its first side at least one first region, being located adjacent to the edge side of the baseplate and proceeding in a first plane. At the at least one first region and the baseplate are free of the encapsulation material. The baseplate is configured for being connected to the heat dissipating element by applying a clamping force with a clamping part to the at least one first region. The baseplate at the edge side adjacent to the first region is at least partly covered by the encapsulation material, wherein at least one of features a) and b) is realized, wherein features a) and b) are defined as follows.

For feature a), at the edge side, the encapsulating material has a first area of cross section, the first area of cross section proceeding parallel to the first plane, and has a second area of cross section in a second plane, the second plane proceeding parallel to the first plane and being different from the first plane, wherein the first area of cross section is closer to the first plane compared to the second area of cross section, wherein the first area of cross section is smaller than the second area of cross section.

For feature b), in a situation where the baseplate is connected to the heat dissipating element by the clamping force acting on the clamping part and pressing the baseplate to the heat dissipating element, the clamping part has a third area of cross section parallel to the first plane and abutting the first plane, and the clamping part has a fourth area of cross section in a third plane proceeding parallel to the first plane and being different to the first plane, wherein the third area of cross section is smaller than the fourth area of cross section.

Such a power semiconductor module provides significant advantages over solutions of the prior art, especially with regard to the mechanical stability of the power semiconductor module when connected to the heat dissipating element and thus during the production process. Further, an improved encapsulation of the baseplate with enhanced integrity of the encapsulation material may be reached.

Embodiments of the present invention thus refer to a power semiconductor module comprising a baseplate having a first side at which it may carry an electric circuit, having a second side being located opposite to the first side and an edge side connecting the first and the second side. Such an arrangement is generally known for power semiconductor modules.

BRIEF DESCRIPTION OF THE DRAWINGS

These and other aspects of the invention will be apparent from and elucidated with reference to the embodiments described hereinafter. Individual features disclosed in the embodiments can constitute alone or in combination an aspect of the present invention. Features of the different embodiments can be carried over from one embodiment to another embodiment. In the drawings.

Figure 1:
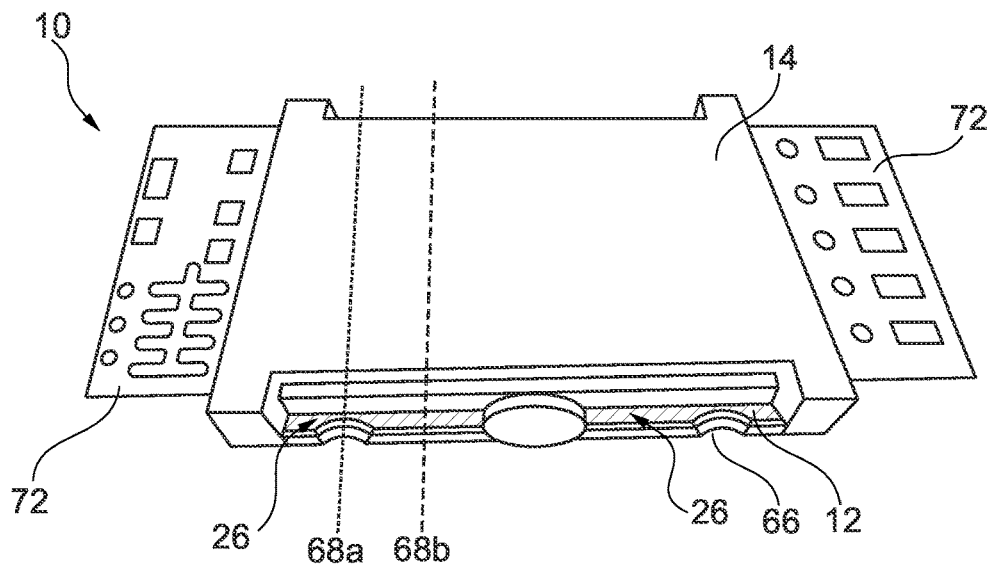
FIG. 1 shows a schematic perspective view of a power semiconductor module, according to a first embodiment of the invention.

The following reference numbers can be used in conjunction with the drawings:

10 power semiconductor module
12 baseplate
14 encapsulation material
16 first side
18 second side
20 edge side
22 first plane
24 heat dissipating element
26 first region of baseplate
28 clamping part
30 screw
32 sealing ring
34 groove
36 second area of cross section of encapsulation material
38 second plane
40 arrow, representing clamping force
42 contact area between clamping part and encapsulation material
44 first area of cross section of encapsulation material
46 first thickness of encapsulation material
48 second thickness of encapsulation material
50 boundary of encapsulation material
52 fourth area of cross section of clamping part
54 third plane
56 first thickness of clamping part
58 second thickness of clamping part
60 boundary of clamping part
62 second region of baseplate
64 thickness of encapsulation material
66 recess
68 sectional view plane
70 third area of cross section of clamping part
72 contact

DETAILED DESCRIPTION OF ILLUSTRATIVE EMBODIMENTS

Embodiments will first be described in text after which examples will be provided with respect to the drawings.

In one embodiment, a power semiconductor module comprises a baseplate being at least in part covered by an encapsulation material. The baseplate comprises a first side, a second side being located opposite to the first side, and an edge side connecting the first side and the second side. The baseplate at its first side is configured for being provided with an electric circuit and the baseplate at its second side is configured for being brought into contact to a heat dissipating element. The baseplate comprises at its first side at least one first region, being located adjacent to the edge side of the baseplate and proceeding in a first plane. At the at least one first region and the baseplate are free of the encapsulation material. The baseplate is configured for being connected to the heat dissipating element by applying a clamping force with a clamping part to the at least one first region. The baseplate at the edge side adjacent to the first region is at least partly covered by the encapsulation material, wherein at least one of features a) and b) is realized, wherein features a) and b) are defined as follows.

For feature a), at the edge side, the encapsulating material has a first area of cross section, the first area of cross section proceeding parallel to the first plane, and has a second area of cross section in a second plane, the second plane proceeding parallel to the first plane and being different from the first plane, wherein the first area of cross section is closer to the first plane compared to the second area of cross section, wherein the first area of cross section is smaller than the second area of cross section.

For feature b), in a situation where the baseplate is connected to the heat dissipating element by the clamping force acting on the clamping part and pressing the baseplate to the heat dissipating element, the clamping part has a third area of cross section parallel to the first plane and abutting the first plane, and the clamping part has a fourth area of cross section in a third plane proceeding parallel to the first plane and being different to the first plane, wherein the third area of cross section is smaller than the fourth area of cross section.

The baseplate at its second side is configured for being brought into contact to a heat dissipating element in order to dissipate heat generated by the electric circuit. A heat dissipating element may for example be an active cooler, such as cooled by a cooling fluid, or the heat dissipating element may be a passive cooler such as a heat sink, for example. In order to avoid exerting the clamping force for connecting the baseplate to the heat dissipating element on the encapsulation material and further to achieve a high stability arrangement, the baseplate comprises at its first side the at least the one first region. The at least one first region is located adjacent to the edge side of the baseplate and proceeds in the first plane. In other words, the first plane may be defined by the first region on the first side of the baseplate.

It may be provided that the whole first side proceeds in the first plane or that only one or more first regions proceed in the first plane.

At the at least one first region of the baseplate, the baseplate is free of the encapsulation material. In other words, the baseplate is not covered by and thus not in touch with the encapsulation material at the at least one first region. In this first region where there is no encapsulation material on the first side of the baseplate, the clamping force of the clamping part can be directly applied to the baseplate. In other words, the first region acts as a support for positioning the clamping part. Therefore, danger to damage the encapsulation material is reduced. Hence, the baseplate is configured for being connected to the heat dissipating element by applying the clamping force with the clamping part to the at least one first region of the baseplate and thus directly to the baseplate.

The edge side of the baseplate may for example proceed in a plane being arranged perpendicular to the first plane and the plane of the second side of the baseplate. The edge side adjacent to the at least one first region may be covered at least in part by a particularly thin portion of encapsulation material, such that the encapsulation material may abut the first plane. This may lead to an improved producibility of the power semiconductor module, since the covering of the edge side of the baseplate may be due to an applied transfer molding process for encapsulation of the power semiconductor module. In the transfer molding process, the baseplate may be brought into a mold form and may be partly covered with encapsulation material. Due to tolerances in the dimensions of the baseplate and the mold form and especially due to the fact that during transfer molding, no lateral clamping is performed, the baseplate at the edge side adjacent to the at least one first region is at least partly covered with the encapsulation material. Consequently a defined layer with e.g. defined thickness and dimensions of encapsulation material should be provided. In other words, the provision of an encapsulation material at the edge side may be a consequence of a transfer molding process which is used for encapsulating the electric circuit and in part the baseplate.

When attaching the baseplate to the heat dissipating element by applying the clamping force with the clamping part to the baseplate on the first region on the first side, the clamping force may not only be applied to the first region, which is free of the encapsulation material, but also to the encapsulation material covering the edge side of the baseplate adjacent to the at least one first region. This is especially the case when the encapsulation material covering the edge side abuts the first plane. In other words, the encapsulation material may also support the clamping part. Due to the properties of typical encapsulation materials, which often show a brittle behavior, the danger that cracks to occur in the encapsulation material often cannot be avoided and the mechanical stability of the power semiconductor module may be put in jeopardy.

To reduce the above mentioned risk, the invention proposes two options both of which significantly reduce the danger of cracks in the encapsulation material by comparable solutions.

According to a first option, the encapsulation material is provided on the edge side of the baseplate adjacent to the first region in such a way, that the encapsulating material has the first area of cross section, the first area of cross section proceeding parallel to the first plane and optionally abuts the first plane, and has the second area of cross section in the second plane, the second plane proceeding parallel to the first plane and being different from the first plane, wherein the first area of cross section is smaller than the second area of cross section.

The first area of cross section is thus parallel to the first plane and optionally abuts the first plane and may thus act as contact area to the clamping part. It may be an area of the encapsulation material that can be seen on the edge side of the baseplate when looking vertically downwards onto the first side of the baseplate. In other words, the first area of cross section may be that area of cross section which is closest to the first plane and parallel to the latter. The second plane is parallel to the first plane and may be located in between the first plane and the second side of the baseplate or the second plane may correspond to the second side of the baseplate. The second area of cross section of the encapsulation material may correspond to an area of a cutting face of the encapsulation material on the edge side of the baseplate, if the encapsulation material is cut across the second plane. The second area of cross section is larger than the first area of cross section.

This embodiment thus may lead to the fact that an edge region of the encapsulating material from the first plane to a plane perpendicular to the first plane and proceeding to the plane of the second side is different compared to an edge region of the encapsulating material from the plane of the second side to a plane perpendicular to the plane of the second side and proceeding to the first plane.

It can thus be provided that the encapsulating material has no symmetric form with regard to a plane being parallel to the first plane and lying in the center between the plane of the second side and the first plane.

It could be found that such a design of the encapsulation material on the edge side of the baseplate adjacent to the first region reduces the risk that cracks are occurring in the encapsulation material, when the clamping force is applied.

In more detail, due to the fact that the contact area between the encapsulation material and the clamping part may be reduced, the mechanical influence acting on the brittle encapsulation material also is reduced.

Further, this embodiment allows that the pressure which is exerted by the clamping part to the encapsulation material acts close to the interface encapsulation material/baseplate. Thus, a lever action, or a leverage effect, respectively, which acts on the encapsulation material by the clamping part may be reduced to a minimum. This reduces the danger of cracks in the encapsulation material significantly.

As a result, the danger of damaged power semiconductor modules during production and clamping thereof is significantly reduced. This allows achieving a reduced amount of defects and substandard goods during production of the modules.

Apart from that, the danger of broken parts of the encapsulation material appearing at the final application of the module is as well significantly reduced which in turn improves the applicability of the modules.

Further, the danger of power semiconductor devices to be damaged during work is also reduced, allowing an improved long-term reliability.

The same advantages may be realized in an alternative or additional manner when thinking about the second option, according to which a power semiconductor module is provided that is designed such that in a situation where the baseplate is connected to the heat dissipating element by the clamping force acting on the clamping part and pressing the baseplate to the heat dissipating element, the clamping part has a third area of cross section parallel to the first plane and abutting the first plane, and the clamping part has a fourth area of cross section in a third plane proceeding parallel to the first plane and being different to the first plane, wherein the third area of cross section is smaller than the fourth area of cross section.

The third plane is parallel to the first plane and thus parallel to the first region on the first side of the baseplate.

The third plane may be located parallel to the first side of the baseplate, on the side of the clamping part, which exposes pressure to the clamping area. In other words, the third plane may be located above the first side of the baseplate, in case the second side of the baseplate is located below the first side of the baseplate. The third area of cross section may thus be that area of cross section of the clamping part which is closest to the first plane and thus which comes into contact with the first region of the baseplate.

The fourth area of cross section of the clamping part may correspond to an area of a cutting face of the clamping part, if the clamping part is cut across the third plane. In any case, the fourth area of cross section is farer away from the first plane compared to the third area of cross section.

Such a design of the clamping part reduces the risk that cracks occur in the encapsulation material, in the situation where the baseplate is connected to the heat dissipating element by the clamping force acting on the clamping part and pressing the baseplate to the heat dissipating element. Thus, a lever action, or a leverage effect, respectively, which acts on the encapsulation material by the clamping part may be reduced to a minimum.

Due to the fact that the third area of cross section is smaller than the fourth area of cross section, in the situation where the baseplate is connected to the heat dissipating element by the clamping force acting on the clamping part, the area of contact between the clamping part and the encapsulation material covering the edge side of the baseplate adjacent to the first region is smaller than the second area of cross section in the second plane. Further, a lever action acting on the encapsulation material is significantly reduced which again reduced the danger of cracks.

Again, to summarize, having the fourth area of cross section larger than the third area of cross section and thus potentially the area of contact between the clamping part and the encapsulation material covering the edge side of the baseplate adjacent to the first region also reduces the risk of damaging the encapsulation material and therefore the power semiconductor module, when attaching the power semiconductor module to the heat dissipating element.

It may be the case that a risk of damaging the encapsulation material covering the edge side of the baseplate adjacent to the first region may be decreasing with a decreasing area of contact between the clamping part and the encapsulation material covering the edge side of the baseplate adjacent to the first region. It may be the case that there is no area of contact between the clamping part and the encapsulation material covering the edge side of the baseplate at all.

The two described options may both have the effect that in the situation where the baseplate is connected to the heat dissipating element, the area of contact between the clamping part and the encapsulation material may be small, or even may be zero, which in turn may lead to a reduction of the clamping force on the encapsulation material covering the edge side of the baseplate adjacent to the first region. Therefore, fewer cracks may occur in the encapsulation material and the risk for impairing the mechanical integrity of the power semiconductor module may be reduced.

Furthermore, by reducing the contact area between the clamping part and the encapsulation material covering the edge side of the baseplate adjacent to the first region as well as by reducing the pressure acting far from the interface baseplate/encapsulation material, also a torque acting on an interface between the edge side of the baseplate and the encapsulation material covering the edge side of the baseplate may be reduced. This also reduces the danger for impairing the mechanical integrity of the power semiconductor module when attaching the power semiconductor module to the heat dissipating element.

The clamping force may be generated by a screw which may be connected to the heat dissipating element and which may exert a pressure to the clamping part. The clamping part may transfer this pressure onto the first region of the baseplate. Hence the clamping part and the screw may form a fastening device for attaching the power semiconductor module to the heat dissipating element. However, the basis for the clamping force is in no way restricted to a screw.

Summarizing the above, the power semiconductor module provides significant advantages, especially with regard to the mechanical stability of the power semiconductor module when connected to the heat dissipating element and a high quality module to be produced.

The baseplate of the power semiconductor module may comprise at its first side at least one second region, wherein the baseplate at its second region is provided with the electric circuit, and wherein at least one of the baseplate at its second region and the electric circuit is at least partly covered by the encapsulation material. The baseplate may not only comprise the at least one first region but also the at least one second region. Exemplarily, the electric circuit of the power semiconductor module may be provided at the baseplate at the at least one second region. The at least one second region of the baseplate may be next to the at least one first region of the baseplate. It may also be possible that the at least one second region is in the center of the baseplate and not on an edge of the baseplate. At the at least one second region of the baseplate, the baseplate and/or the electric circuit may be at least partly covered with the encapsulation material. The encapsulation material may come into direct contact with the electrical circuit and/or with the baseplate and may cover the electric circuit and/or the first side of the baseplate in the second region.

It thus becomes clear that the one or more second regions, wherein the number is not generally limited and may be chosen according to the desired needs, are provided for positioning the active equipment of the power semiconductor module whereas the one or more first regions serve for fixing the baseplate to the heat dissipating element.

With regard to the number of first regions, this number is also not generally limited and may be chosen according to the desired needs. Thus, the number of clamping areas of cross section which correspond to the first areas of cross section may be selected according to the desired needs. For example, four clamping areas may be provided, two of which are located opposite to another.

With regard to enhancing the mechanical stability, it may be provided that the first area of cross section of the encapsulation material covering the edge side of the baseplate adjacent to the first region is at least 15% smaller, for example at least 25% smaller, in particular at least 50% smaller than the second area of cross section. Further, the first area of cross section may be 75% smaller than the second area of cross section.

Thus, a power semiconductor module may be provided, wherein in the situation where the baseplate is connected to the heat dissipating element by the clamping force acting on the clamping part and pressing the baseplate to the heat dissipating element, the third area of cross section is at least 15% smaller, for example at least 25% smaller, in particular at least 50% smaller than the fourth area of cross section.

Consequently, a power semiconductor module may be provided wherein in the situation where the baseplate is connected to the heat dissipating element by the clamping force acting on the clamping part and pressing the baseplate to the heat dissipating element, the area of contact between the clamping part and the encapsulation material covering the edge side of the baseplate adjacent to the first region is at least 15% smaller than at least one of the second area of cross section and the fourth area of cross section.

The reduction of the contact area between the clamping part and the encapsulation material covering the edge side of the baseplate adjacent to the first region compared to the second area of cross section may lead to an effective reduction of the danger of introducing cracks into the encapsulation material. This may be achieved by having the first area of cross section of the encapsulation material smaller than the second area of cross section. However, for reasons of the mechanical stability of the power semiconductor module, it may be advantageous not to omit the encapsulation material on the edge side of the baseplate completely. Therefore, the above percentage values may be reasonable trade-offs between protecting the edge side of the baseplate by having encapsulation material on the edge side of the baseplate, and reducing the risk of damaging the power semiconductor module when attaching the power semiconductor module to the heat dissipating element.

As already mentioned the second plane may be located in between the plane of the first side of the baseplate and the plane of the second side of the baseplate or even correspond to the plane of second side of the baseplate. Exemplarily, a power semiconductor module may be provided, wherein the second plane corresponds to the plane of the second side of the baseplate. The second plane defines the second area of cross section of the encapsulation material on the edge side of the baseplate. This choice of the location of the second plane may significantly enhance the stability of the encapsulation material on the edge side of the baseplate.

The above described reduction of the danger of damaging the encapsulation material may as such be achieved by varying a thickness of the encapsulation material on the edge side of the baseplate adjacent to the first region. According to that, a power semiconductor module may be provided wherein the encapsulation material has a first thickness at the first plane and has a second thickness in the second plane, and wherein the first thickness is smaller than the second thickness. Exemplarily, the first thickness and second thickness may be determined in a direction perpendicular to the edge side of the baseplate. In other words when looking at a sectional view of the power semiconductor module, wherein the sectional view is along a plane perpendicular to the first plane and perpendicular to the edge side of the baseplate, the first and the second thicknesses can directly be shown in this sectional view.

With regard to the above described variation of the thickness of the encapsulation material on the edge side of the baseplate adjacent to the first region and thus with regard to the first and second thickness, a power semiconductor module may be provided, wherein the encapsulation material on the edge side of the baseplate may have a form of at least one of a circular arc, one step or a plurality of steps, a bevel and a chamfer. This may mean that the first thickness may not only be smaller than the second thickness, but a boundary of the encapsulation material that connects the first and the second thickness may also have the form of a circular arc, one step or a plurality of steps, a bevel and/or a chamfer.

Having the form of a circular arc may mean that the curvature of the boundary of the encapsulation material may be constant. In other words, it may appear in the above described sectional view, that the first and second thickness may be connected by a circular arc. The curvature may be positive or negative, meaning that the boundary of cross section of the encapsulation material may be convex or concave.

Having the form of one step or a plurality of steps may mean that the boundary of the encapsulation material that connects the first and the second thickness has abrupt changes of directions. Furthermore, the directional changes may be around 90 degrees, for example 90 degrees+/−20%. In other words, it may appear in the above described sectional view, that the first and second thickness may be connected by a line that has the form of a step function.

Having the form of a bevel may mean that the boundary of the encapsulation material that connects the first and the second thickness has a constant inclination. In other words, it may appear in the above described sectional view, that the first and second thickness may be connected by a straight line.

Furthermore, having the form of a bevel may also mean that the first thickness may be zero or close to zero. This may mean that the area of contact between the clamping part and the encapsulation material on the edge side of the baseplate adjacent to the first region may be zero or close to zero.

Having the form of a chamfer may mean that the boundary of the encapsulation material that connects the first and the second thickness has a constant inclination. In other words, it may appear in the above described sectional view, that the first and second thickness may be connected by a straight line. However, compared to the bevel, having the form of a chamfer may mean that the first thickness may not be close to zero. This may also mean that the area of contact between the clamping part and the encapsulation material on the edge side of the baseplate adjacent to the first region may not be zero.

Furthermore, it may also be possible that the boundary of the encapsulation material that connects the first and the second thickness has any other form, such as an arbitrary form, as long as the first thickness is smaller than the second thickness. Hence, in the above described sectional view, the first and second thickness may be connected by a line, that has the form of an exponential, of a parabola, a hyperbola, or of a mixture of any of the above mentioned possibilities.

According to a further embodiment, the second thickness, such as the maximum thickness of the encapsulation material present at the edge side of the baseplate, may be in a range of 0.1 mm to 10.0 mm such as 0.5 mm to 2.0 mm. It may be the case that the power semiconductor module may be better protected if the second thickness is large. Furthermore, the first thickness may be 0.05 mm or more; however, the first thickness may be smaller than the second thickness.

According to a further embodiment, the first thickness may lie below 0.05 mm, such as between 0 mm and 0.05 mm. In this context a power semiconductor module may be provided, wherein a thickness of the baseplate, proceeding from the first plane to the plane of the second side, may be the same compared to a parallel thickness of the encapsulating material on the edge side. The thickness of the baseplate may be the shortest distance between the first plane and the plane of the second side of the baseplate. The thickness of the baseplate may be measured perpendicular to first plane and second side of the baseplate. The parallel thickness of the encapsulation material on the edge side adjacent to the first region may be parallel to the thickness of the baseplate. Being the same may mean that the parallel thickness of the encapsulation material is equal to thickness of baseplate +/−10%, referring to the smaller thickness. For example, being the same may mean that the parallel thickness of the encapsulation material is equal to thickness of baseplate allowing a deviation of −10% referring to the smaller thickness. To have the parallel thickness of the encapsulation material on the edge side of the baseplate essentially as large as the thickness of the baseplate may increase the protection of the edge side of the baseplate. In other words, this may mean, that the entire edge side of the baseplate may be covered with the encapsulation material. Furthermore, this may enhance producibility of the power semiconductor module by the transfer molding process.

As already mentioned, the baseplate of the power semiconductor module comprises the at least one first region, where the baseplate is on its first side free of the encapsulation material at the first region. It may be advantageous for mechanically connecting the baseplate to the heat dissipating element, to have more than one first regions. Accordingly, a power semiconductor module may be provided, wherein the baseplate comprises at least two first regions, such as four first regions. Exemplarily, two first regions on the first side of the baseplate, wherein the two first regions are free of the encapsulation material and are both adjacent to the edge side of the baseplate, may be located opposite to each other. Therefore, the baseplate can be connected to the heat dissipating element more easily and reliably.

Further exemplarily, the baseplate may comprise four first regions. For a baseplate that has an essentially rectangular form, these four first regions may be located such that each side of the rectangular form is next to one of the four first regions. In particular, these four first regions may be located such that two sides of the rectangular form that are opposite to each other are next to two of the four first regions. Hence, one of the first regions may be located next to another of the first region on the same side of the rectangular form. Nevertheless, an arbitrary number of first regions with arbitrary positions is possible, especially, if the power module does not have a rectangular shape.

In order to connect the baseplate to the heat dissipating element, the baseplate may comprise as an option but in no way mandatory a recess and/or hole in the at least one first region. Exemplarily the baseplate comprises a recess and/or hole in every first region. In particular, the baseplate may comprise a recess, a screw hole, a mounting hole and/or any other device for fixing the baseplate to the heat dissipating element. A recess may have the form of half a circle or at least a part of a circle. A recess may have the advantage that in a situation where two baseplates which both have a recess, are located next to each other, the two recesses together may form a screw hole. Therefore, both baseplate may be attached to a heat dissipating element simultaneously with one screw.

As already mentioned above, the power semiconductor module may have an essentially rectangular shaped form or a parallelogram. An essentially rectangular shaped form may be the form of a rectangle with rounded corners. An essentially rectangular shaped form may be an advantage with regard to the potential stacking of several power semiconductor modules or with regard to attaching the power semiconductor module to the heat dissipating element or any other additional component. However, further forms of the power semiconductor module such as of the baseplate may be possible according to the desired needs.

With regard to further advantages and technical features of the power semiconductor module, it is referred to the arrangement comprising the power semiconductor, the clamping part and the heat dissipating element, the figures and the further description.

Embodiments of the present invention further relate to an arrangement comprising a power semiconductor module, a heat dissipating element and a clamping part, wherein the power semiconductor module comprises a baseplate, wherein the baseplate is connected to the heat dissipating element by the clamping force acting on the clamping part and pressing the baseplate to the heat dissipating element, wherein the power semiconductor module is arranged as described in the further description.

In the above described arrangement the baseplate is attached to the heat dissipating element by applying the clamping force with the clamping part on the first region on the first side of the baseplate. The clamping part may be in direct contact to the first region on the first side of the baseplate. The clamping force may be generated by screwed clamps, which may be used to press down the power semiconductor module to the heat dissipating element and to provide a tight sealing between the second side of the baseplate and the heat dissipating element. A sealing ring may be located in a groove of the heat dissipating element to provide a tight sealing.

Because of the high pressure of the clamping force, the first region of the baseplate is uncoated from the encapsulation material in order to avoid damaging the latter. Furthermore, in order to reduce the danger that damages occur as the clamping force is not only exerted to the first region of the baseplate, which is free of the encapsulation material, but also to the encapsulation material covering the edge side of the baseplate adjacent to the first region, either feature a) or b) are realized, wherein these features are defined as follows:

a) at the edge side, the encapsulating material has a first area of cross section, the first area of cross section proceeding parallel to the first plane and optionally abutting the first plane, and has a second area of cross section in a second plane, the second plane proceeding parallel to the first plane and being different from the first plane, wherein the first area of cross section is smaller than the second area of cross section, and b) in a situation where the baseplate is connected to the heat dissipating element by the clamping force acting on the clamping part and pressing the baseplate to the heat dissipating element, the clamping part has a third area of cross section parallel to the first plane and abutting the first plane, and the clamping part has a fourth area of cross section in a third plane proceeding parallel to the first plane and being different to the first plane, wherein the third area of cross section is smaller than the fourth area of cross section.

The above describe arrangement may lead to an effective reduction of the danger of introducing cracks into the encapsulation material. Therefore, the mechanical stability of the power semiconductor module is increased.

Both features a) and b) may lead to a reduction of the contact area between the clamping part and the encapsulation material covering the edge side of the baseplate adjacent to the first region. Thus, feature a) may be realized or feature b) may be realized or both of features a) and b) may be realized.

The reduction of the contact area between the clamping part and the encapsulation material covering the edge side of the baseplate adjacent to the first region may lead to a reduction of the clamping force and of a torque on the encapsulation material covering the edge side of the baseplate adjacent to the first region, and/or the reduction of lever effects. In turn, fewer cracks may occur in the encapsulation material and the risk for impairing the mechanical integrity of the power semiconductor module may be reduced.

The above described reduction of the contact area may be achieved by the design of the encapsulation material on the edge side of the baseplate that is described in the description of the power semiconductor module. Further, it may be achieved by the design of the clamping part that is also described in the description of the power semiconductor module.

With regard to the design of the clamping part, the third area of cross section may be at least 15% smaller than the fourth area of cross section. This may be achieved by varying a thickness of the clamping part. Correspondingly, the first area of cross section may be at least 15% smaller than the second area of cross section. This may be achieved by varying a thickness of the encapsulation material at the edge side of the baseplate.

Accordingly, an arrangement may be provided, wherein the clamping part may have a first thickness at the first plane and may have a second thickness in the third plane, and the first thickness may be smaller compared to the second thickness. The first and second thickness of the clamping part may be determined in a direction perpendicular to the edge side of the baseplate.

With regard to the above described varying thickness of the clamping part, an arrangement may be provided, wherein the clamping part has a form of a circular arc, one step or a plurality of steps, and/or a chamfer. In other words, the first thickness of the clamping part may not only be smaller than the second thickness, but the boundary of the clamping part that connects the first and the second thickness may also have the form of a circular arc, one step or a plurality of steps, and/or a chamfer.

Having the form of a circular arc may mean that the curvature of the boundary of the clamping may be constant. In other words, it may appear in a section view in a plane that is perpendicular to the first plane and perpendicular to the edge side of the baseplate, that the first and second thickness may be connected by a circular arc. The curvature may be positive or negative, meaning that the boundary of the clamping part may be convex or concave.

Having the form of one step or a plurality of steps may mean that the boundary of the clamping part that connects the first and the second thickness has abrupt changes of directions. Furthermore, the directional changes may be around 90 degrees. In other words, in the above described sectional view it may appear that that the first and second thicknesses may be connected by a line having the form of a step function.

Having the form of a chamfer may mean that the boundary of the clamping part that connects the first and the second thickness has a constant inclination. In other words, it may appear in the above described sectional view, that the first and second thicknesses may be connected by a straight line.

Furthermore, it may also be possible that the boundary of the clamping part that connects the first and the second thickness has any other form, such as an arbitrary form, as long as the first thickness of the clamping part is smaller than the second thickness. Hence, in the above described sectional view, the first and second thickness may be connected by a line, that has the form of an exponential, of a parabola, a hyperbola, or of a mixture of any of the above mentioned possibilities.

Generally, the baseplate may thus be provided with an encapsulation material such that at the at least one first region of the baseplate, the first side of the baseplate is free of the encapsulation material, and the edge side of the baseplate adjacent to the first region is at least partly covered by the encapsulation material such, that the encapsulation material abuts the first plane, and wherein at least one of features a) and c) applies:

a) at the edge side, the encapsulating material has a first area of cross section, the first area of cross section proceeding parallel to the first plane and optionally abutting the first plane, and has a second area of cross section in a second plane, the second plane proceeding parallel to the first plane and being different from the first plane, wherein the first area of cross section is closer to the first plane compared to the second area of cross section, wherein the first area of cross section is smaller than the second area of cross section, and c) in a situation where the baseplate is connected to the heat dissipating element by the clamping force acting on the clamping part and pressing the baseplate to the heat dissipating element, an area of contact between the clamping part and the encapsulation material covering the edge side of the baseplate adjacent to the first region is smaller than a second area of cross section in a second plane, the second plane proceeding parallel to the first plane and being different from the first plane.

With this regard, the step of providing the baseplate with the encapsulation material may comprise a transfer molding process.

Exemplarily, the encapsulation material may be provided on the first side of the baseplate and on the edge side of the baseplate adjacent to the first region in the transfer molding process.

The step of providing the baseplate with an encapsulation material may already lead to the power semiconductor module, wherein the encapsulation material on the edge side of the baseplate has feature a) and/or c)

Alternatively, the encapsulation material on the edge side of the baseplate may be post-processed in a subsequent processing step, in order to realize feature a) and/or c).

In this context the method of post-processing may comprise the step of chamfering and/or beveling the encapsulation material covering the edge side of the baseplate adjacent to the first region. This may be an easy way to realize the above feature and to reduce the risk of damaging in the encapsulation material when connecting the power semiconductor to the heat dissipating element. The encapsulation material covering the edge side of the baseplate adjacent to the first region may be chamfered and/or beveled such that the encapsulating material has the first area of cross section being smaller than the second area of cross section.

Furthermore, the method may comprise the step of providing a clamping part configured such that in a situation, where the baseplate is connected to the heat dissipating element by a clamping force acting on the clamping part and pressing the baseplate to the heat dissipating element, the clamping part may have a third area of cross section parallel to the first plane and abutting the first plane, and the clamping part may have a fourth area of cross section in a third plane proceeding parallel to the first plane and being different to the first plane, wherein the third area of cross section may be smaller than the fourth area of cross section.

To summarize the above, embodiments can address how to enhance the mechanical stability of the power semiconductor module at the encapsulation material in particular at edge sides of the baseplate, especially with regard to reducing the danger of damaging the encapsulation material when attaching the power semiconductor to the heat dissipating element and how to enhance the producibility of the power semiconductor module.

With regard to further advantages and technical features of the arrangement comprising the power semiconductor, the clamping part and the heat dissipating element, it is referred to the power semiconductor module, the figures and the further description.

Examples of certain embodiments will now be described with respect to the figures.

Figure 2:
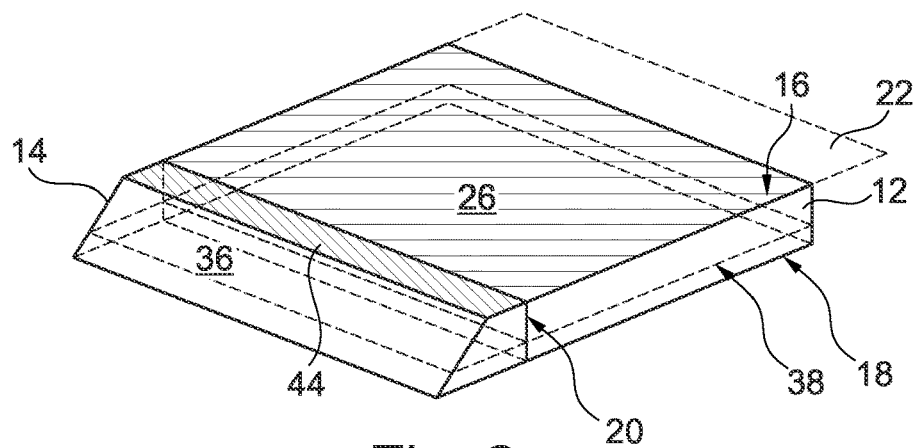
FIG. 2 shows a schematic perspective view of a cut-out of the power semiconductor module of the embodiment of FIG. 1.

FIG. 1 shows a schematic perspective view of a power semiconductor module 10. FIG. 2 shows a detailed perspective view of a cut-out of the power semiconductor module 10 of FIG. 1. The power semiconductor module 10 comprises a baseplate 12 being at least in part covered by an encapsulation material 14. The baseplate 12 of the power semiconductor module 10 comprises a first side 16 and a second side 18, located opposite to the first side 16. The first side 16 and the second side 18 are connected by an edge side 20 of the baseplate 12. The baseplate 12 at its first side 16 is configured for being provided with an electric circuit. In FIG. 1, the perspective view prevents the display of the second side 18 of the baseplate 12.

Figure 3:
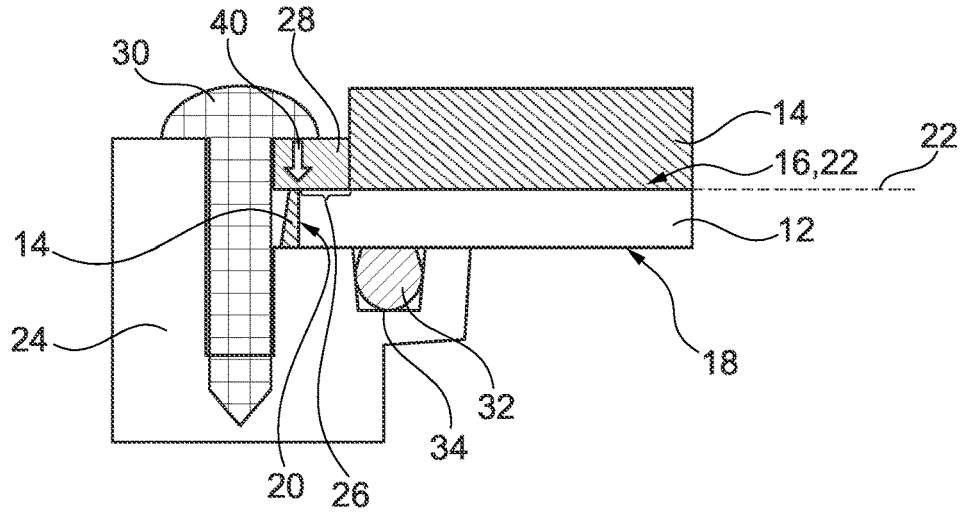
FIG. 3 shows a sectional view of the power semiconductor module of the embodiment of FIG. 1.

FIG. 3 shows a sectional view of the power semiconductor module 10, along a sectional view plane 68a like indicated in FIG. 1 perpendicular to the first side 16 of the baseplate 12 and perpendicular to the edge side 20 of the baseplate 12, in a situation where the power semiconductor module 10 is attached to a heat dissipating element 24.

The baseplate 12 at its second side 18 is adapted to be brought into contact to the heat dissipating element 24. In order to attach the baseplate 12 to the heat dissipating element 24, the first side 16 of the baseplate 12 comprises at least one first region 26, being located adjacent to the edge side 20 of the baseplate 12, which is free of the encapsulation material 14, i.e., which is not covered by the encapsulation material 14. In this first region 26, the baseplate 12 defines a first plane 22.

The baseplate 12 is adapted for being connected to the heat dissipating element 24 by applying a clamping force, indicated by arrow 40, with a clamping part 28 onto the first region 26 of the first side 16 of the baseplate 12. The clamping part 28 is not visible in FIG. 1, but in FIG. 3, which shows the principle of attaching the baseplate 12 to the heat dissipating element 24.

For attaching the baseplate 12 to the heat dissipating element 24, the clamping part 28 is pressed against the first region 26 of the baseplate 12. The clamping force is generated by a screw 30, which is screwed into the heat dissipating element 24. In this embodiment a sealing ring 32 may be located in a groove 34 of the heat dissipating element 24 to provide a tight sealing. As is visible in FIGS. 1 to 3, the edge side 20 of the baseplate 12 adjacent to the first region 26 is at least partly covered by the encapsulation material 14.

The power semiconductor module 10 shown in FIG. 1 comprises four first regions 26, wherein two of them are located such that they are visible in the perspective of FIG. 1. As is visible in FIG. 1, the two first regions 26 are next to each other on a side of the baseplate 12. In between the two first regions 26 there is encapsulation material separating the two first regions 26 from each other. Furthermore, the power semiconductor module 10 of FIG. 1 comprises a plurality of contacts 72 outside the encapsulation material 14, for electrically connecting the electrical circuits that are covered by the encapsulation material 14. In this embodiment the contacts 72 are located on the side of the baseplate 12, where no first regions 26 are located.

FIG. 2 shows a detailed view of the first region 26 of the baseplate 12, where the first side 16 of the baseplate 12 is free of the encapsulation material 14. The edge side 20 of the baseplate 12 adjacent to the first region 26 is covered by the encapsulation material 14. In order to reduce the risk of damaging the encapsulation material 14 on the edge side 20 of the baseplate 12 when exerting the clamping force, a first area of cross section 44 of the encapsulation material 14 in a plane parallel to the first plane 22 and abutting the first plane 22, is smaller than a second area of cross section 36 of the encapsulation material 14 in a second plane 38, wherein the second plane 38 is parallel to the first plane 22.

Furthermore, as is visible in FIG. 1, the baseplate 12 comprises in the first region 26 a recess 66, which gives room for the screw 30, when attaching the power semiconductor module 10 to the heat dissipating element 24.

Figure 4:
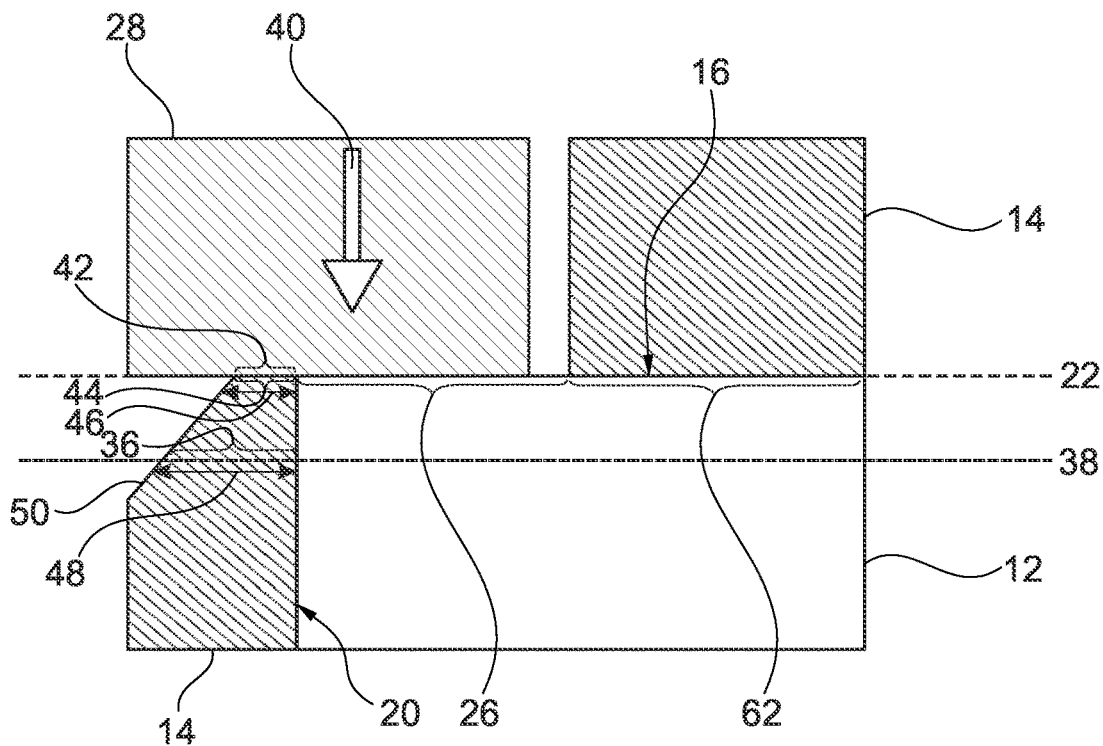
FIG. 4 shows a schematic sectional view of the power semiconductor module of the embodiment of FIG. 1.

FIG. 4 shows another sectional view of the power semiconductor module 10, along a sectional view plane 68b, perpendicular to the first plane 22 and perpendicular to the edge side 20 of the baseplate 12, in a situation where the power semiconductor module 10 is attached to the heat dissipating element 24. However, the heat dissipating element 24 is not shown in FIG. 4. Therefore, in FIG. 4 only the baseplate 12, the clamping part 28 and the encapsulation material 14 are visible. The clamping force, which is exerted on the baseplate 12 by the clamping part 28, is represented by the arrow 40.

In the situation where the baseplate 12 is connected to the heat dissipating element 24 by the clamping force acting on the clamping part 28 and pressing the baseplate 12 to the heat dissipating element 24, an area of contact 42 between the clamping part 28 and the encapsulation material 14 covering the edge side 20 of the baseplate 12 adjacent to the first region 26 is smaller than the second area of cross section 36 of the encapsulation material 14 in the second plane 38.

Furthermore, as can be seen in FIG. 4, the encapsulation material 14 has a first thickness 46 in the first plane 22 and has a second thickness 48 in the second plane 38, wherein the first thickness 46 and second thickness 48 are determined in a direction perpendicular to the edge side 20 of the baseplate 12 and wherein the first thickness 46 is smaller than the second thickness 48.

As is also visible in FIG. 4, the first thickness 46 is not only smaller than the second thickness 48, but a boundary 50 of the encapsulation material 14 that connects the first and the second thicknesses 46, 48 has the form of a chamfer. This means that the boundary 50 of the encapsulation material 14 has a constant inclination. Furthermore, in this embodiment the first thickness 46 is exemplarily 0.5 mm and the second thickness 48 is 1 mm.

Figure 5:
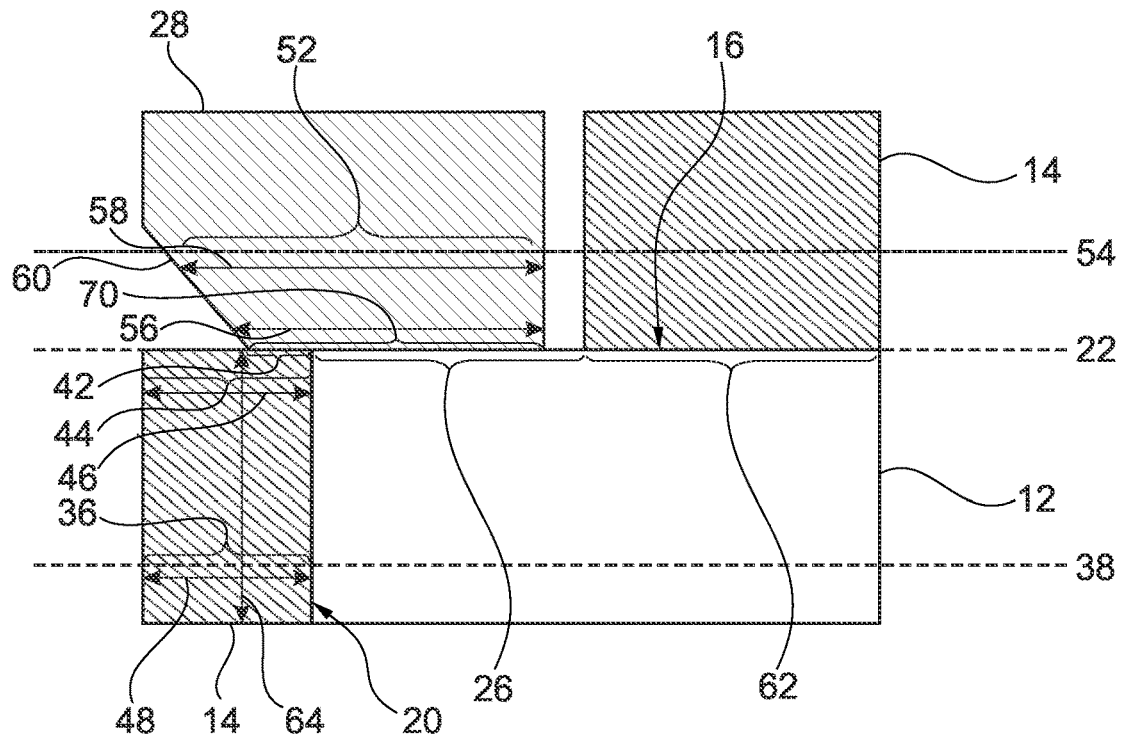
FIG. 5 shows a schematic sectional view of a power semiconductor module, according to another embodiment of the invention.

FIG. 5 shows another embodiment of the power semiconductor module 10 in a schematic sectional view. In this embodiment in analogy to the embodiment of FIG. 4, in the situation where the baseplate 12 is connected to the heat dissipating element 24 by the clamping force acting on the clamping part 28 and pressing the baseplate 12 to the heat dissipating element 24, the area of contact 42 between the clamping part 28 and the encapsulation material 14 covering the edge side 20 of the baseplate 12 adjacent to the first region 26 is smaller than the second area of cross section 36 of the encapsulation material 14 in the second plane 38.

However, in contrast to the embodiment of FIG. 4, the first thickness 46 of the encapsulation material 14 on the edge side 20 of the baseplate 12 is essentially the same as the second thickness 48 of the encapsulation material 14. Instead, a fourth area of cross section 52 of the clamping part 28 in a third plane 54 parallel to the first plane 22 is larger than a third area of cross section 70 in the first plane 22.

The third plane 54 is also parallel to the first plane 22 and therefore parallel to the first region 26 of the first side 16 of the baseplate 12. In FIG. 5 the third plane 54 is located above the first side 16 of the baseplate 12.

As is also visible from FIG. 5, the clamping part 28 has a first thickness 56 in the first plane 22 and has a second thickness 58 in the third plane 54, and the first thickness 56 is smaller than the second thickness 58. In analogy to the embodiment in FIG. 4, a boundary 60 of the clamping part 28 comprises a form of a chamfer.

In all embodiments the baseplate 12 comprises at its first side 16 a second region 62. The second region 62 is covered by the encapsulation material 14. At the second region 62 the first side 16 of the baseplate 12 is provided with the electric circuit.

Furthermore, the encapsulation material 14 that covers the edge side 20 of the baseplate 12 adjacent to the first region 26 has a parallel thickness 64, which is essentially equal to a thickness of baseplate 12. The thickness of the baseplate 12 may be the shortest distance between the first plane 22 and the second side 18 of the baseplate. The parallel thickness 64 of the encapsulation material 14 on the edge side 20 of the baseplate is determined in a parallel direction to the thickness of the baseplate 12.

The described embodiments can, alone or in any combination of the respective embodiments, provide a feature of the present invention unless not clearly excluded.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A power semiconductor module comprising:
    a baseplate comprising a first side, a second side opposite to the first side, and an edge side connecting the first side and the second side, wherein the baseplate comprises at its first side a first region located adjacent to the edge side of the baseplate and proceeding in a first plane;
    an encapsulation material covering portions of the baseplate, wherein the first region of the baseplate is free of the encapsulation material and the baseplate at the edge side adjacent to the first region is at least partly covered by the encapsulation material;
    an electric circuit provided at the first side of the baseplate;
    a clamping part having a first area of cross section parallel to the first plane and physically contacting the first region of the baseplate along the first plane so that the clamping part at the first area of cross section applies a clamping force to the baseplate at the first region, the clamping part also including a second area of cross section in a second plane that is parallel to the first plane and farther from the baseplate than the first plane, wherein the first area of cross section is smaller than the second area of cross section; and
    a heat dissipating element in contact with the second side of the baseplate, wherein the baseplate is connected to the heat dissipating element by applying a clamping force with the clamping part to the first region.

2. The power semiconductor module according to claim 1, wherein, at the edge side, the encapsulation material has a third area of cross section parallel to the first plane and a fourth area of cross section in a third plane that is parallel to the first plane and different than the first plane, wherein the third area of cross section is closer to the first plane compared to the fourth area of cross section, and wherein the third area of cross section is smaller than the fourth area of cross section.

3. The power semiconductor module according to claim 1, wherein the baseplate comprises at its first side at least one second region, wherein the baseplate at the second region is provided with the electric circuit, and wherein at least one of the baseplate at its second region and the electric circuit is at least partly covered by the encapsulation material.

4. The power semiconductor module according to claim 1, wherein an area of contact between the clamping part and the encapsulation material covering the edge side of the baseplate adjacent to the first region is at least 15% smaller than the second area of cross section.

5. The power semiconductor module according to claim 1, wherein the first area of cross section is at least 15% smaller than the second area of cross section.

6. The power semiconductor module according to claim 1, wherein the second plane corresponds to a plane of the second side.

7. The power semiconductor module according to claim 1, wherein the encapsulation material on the edge side has a form of a circular arc, a single step, a plurality of steps, a bevel or a chamfer.

8. The power semiconductor module according to claim 1, wherein a thickness of the baseplate, proceeding from the first plane to a plane of the second side, is the same compared to a parallel thickness of the encapsulation material on the edge side.

9. The power semiconductor module according to claim 1, wherein the baseplate comprises a plurality of first regions.

10. The power semiconductor module according to claim 1, wherein the baseplate comprises a recess or a hole at the first region.

11. The power semiconductor module according to claim 1, wherein an area of contact between the clamping part and the encapsulation material covering the edge side of the baseplate adjacent to the first region is smaller than the second area of cross section of the encapsulation material in the second plane.

12. A power semiconductor module comprising a baseplate that is at least partially covered by an encapsulation material and a clamping part;
    wherein the baseplate comprises a first side, a second side located opposite to the first side, and an edge side connecting the first side and the second side;
    wherein the baseplate at its first side is configured for being provided with an electric circuit and wherein the baseplate at its second side is configured for being brought into contact to a heat dissipating element;
    wherein the baseplate comprises at its first side at least one first region that is located adjacent to the edge side of the baseplate and proceeding in a first plane;

wherein at the at least one first region of the baseplate is free of the encapsulation material;

wherein the baseplate at the edge side adjacent to the first region is at least partly covered by the encapsulation material;

wherein the baseplate is contacted with the heat dissipating element by a clamping force acting on the clamping part and pressing the at least one first region of the baseplate to the heat dissipating element;

wherein the clamping part has a first area of cross section parallel to the first plane and physically contacting the first region of the baseplate along the first plane so that the clamping part at the first area of cross section applies a clamping force to the baseplate at the first region;

wherein the clamping part has a second area of cross section in a second plane proceeding parallel to the first plane and being farther from the baseplate than the first plane;

and wherein the first area of cross section is smaller than the second area of cross section.

13. The power semiconductor module according to claim 12, wherein the edge side of the baseplate partly covered by the encapsulation material is slanted in a direction extending from the baseplate.

14. The power semiconductor module according to claim 12, wherein the baseplate comprises at its first side at least one second region, wherein the baseplate at the second region is provided with the electric circuit.

15. The power semiconductor module according to claim 14, wherein the baseplate at its second region or the electric circuit is at least partly covered by the encapsulation material.

16. The power semiconductor module according to claim 12, wherein an area of contact between the clamping part and the encapsulation material covering the edge side of the baseplate adjacent to the first region is at least 15% smaller than the second area of cross section.

17. The power semiconductor module according to claim 12, wherein the first area of cross section is at least 15% smaller than the second area of cross section.

18. The power semiconductor module according to claim 12, wherein an area of contact between the clamping part and the encapsulation material covering the edge side of the baseplate adjacent to the first region is smaller than the second area of cross section of the encapsulation material in the second plane.

19. The power semiconductor module according to claim 12, wherein a thickness of the baseplate, proceeding from the first plane to a plane of the second side, is the same compared to a parallel thickness of the encapsulation material on the edge side.

20. A power semiconductor module comprising:

a baseplate comprising a first side, a second side opposite to the first side, and an edge side connecting the first side and the second side, wherein the baseplate comprises at its first side a first region located adjacent to the edge side of the baseplate and proceeding in a first plane;

an encapsulation material covering portions of the baseplate, wherein the first region of the baseplate is free of the encapsulation material and the baseplate at the edge side adjacent to the first region is at least partly covered by the encapsulation material;

an electric circuit provided at the first side of the baseplate;

a clamping part having a first area of cross section parallel to the first plane and physically contacting the first region of the baseplate along the first plane so that the clamping part at the first area of cross section applies a clamping force to the baseplate at the first region, wherein a side wall of the clamping part slopes away from the first region of the baseplate; and a heat dissipating element in contact with the second side of the baseplate, wherein the baseplate is connected to the heat dissipating element by applying a clamping force with the clamping part to the first region.

\* \* \* \* \*